(12) United States Patent
Müller et al.

(10) Patent No.: US 12,211,629 B2
(45) Date of Patent: Jan. 28, 2025

(54) CONTACT SYSTEM HAVING RELIABLE INSULATION

(71) Applicant: Siemens Aktiengesellschaft, Munich (DE)

(72) Inventors: Volker Müller, Nürnberg (DE); Stephan Neugebauer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 172 days.

(21) Appl. No.: 18/019,973

(22) PCT Filed: Jul. 14, 2021

(86) PCT No.: PCT/EP2021/069637
§ 371 (c)(1),
(2) Date: Feb. 6, 2023

(87) PCT Pub. No.: WO2022/028835
PCT Pub. Date: Feb. 10, 2022

(65) Prior Publication Data
US 2023/0335316 A1    Oct. 19, 2023

(30) Foreign Application Priority Data
Aug. 7, 2020   (EP) .................................. 20189973

(51) Int. Cl.
*H01B 17/56*    (2006.01)
*H01B 5/00*     (2006.01)
(Continued)

(52) U.S. Cl.
CPC ............. *H01B 17/56* (2013.01); *H01B 5/002* (2013.01); *H01L 23/367* (2013.01); *H02G 5/10* (2013.01)

(58) Field of Classification Search
CPC ........ H01B 17/56; H01B 5/002; H01L 23/367
(Continued)

(56) References Cited

U.S. PATENT DOCUMENTS

2014/0034993 A1   6/2014  Shimokawa
2014/0353814 A1  12/2014  Sakamoto et al.
(Continued)

FOREIGN PATENT DOCUMENTS

DE   112012005920 T5   11/2014
EP       2693471 A2    2/2014

OTHER PUBLICATIONS

PCT International Search Report mailed Oct. 27, 2021 corresponding to PCT International Application No. PCT/BP2021/069637 filed Jul. 14, 2021.
(Continued)

*Primary Examiner* — Timothy J Thompson
*Assistant Examiner* — Michael F McAllister
(74) *Attorney, Agent, or Firm* — Henry M. Feiereisen LLC

(57) ABSTRACT

A contact system includes a support body, a heat sink configured to contact the support body in an electrically insulated and/or heat-conducting manner, and an electrically insulating layer arranged between the heat sink and the support body. The heat sink has a first surface which is embodied substantially as a flat area and formed with a recess in a region intended for contacting a periphery of a contact area of the support body. The recess forms an unbroken track on the first surface of the heat sink. The contact area of the support body is located on the heat sink in such a way that the recess extends completely along the periphery of the contact area. The insulating layer between the heat sink and the support body is configured to cover the
(Continued)

recess in such a way that a closed channel is formed by the recess and the insulating layer.

20 Claims, 3 Drawing Sheets

(51) Int. Cl.
*H01L 23/367* (2006.01)
*H02G 5/10* (2006.01)

(58) Field of Classification Search
USPC .......................................................... 174/252
See application file for complete search history.

(56) References Cited

U.S. PATENT DOCUMENTS

| | | |
|---|---|---|
| 2016/0276245 A1* | 9/2016 | Murai ................... H01L 23/367 |
| 2016/0278245 A1 | 9/2016 | Koga et al. |
| 2016/0322274 A1 | 11/2016 | Takizawa |
| 2019/0027421 A1* | 1/2019 | Nishikawa ........ H01L 23/49827 |

OTHER PUBLICATIONS

European Search Report mailed Feb. 4, 2021 corresponding to European Application No. EP20189973.9 filed Aug. 7, 2020.

\* cited by examiner

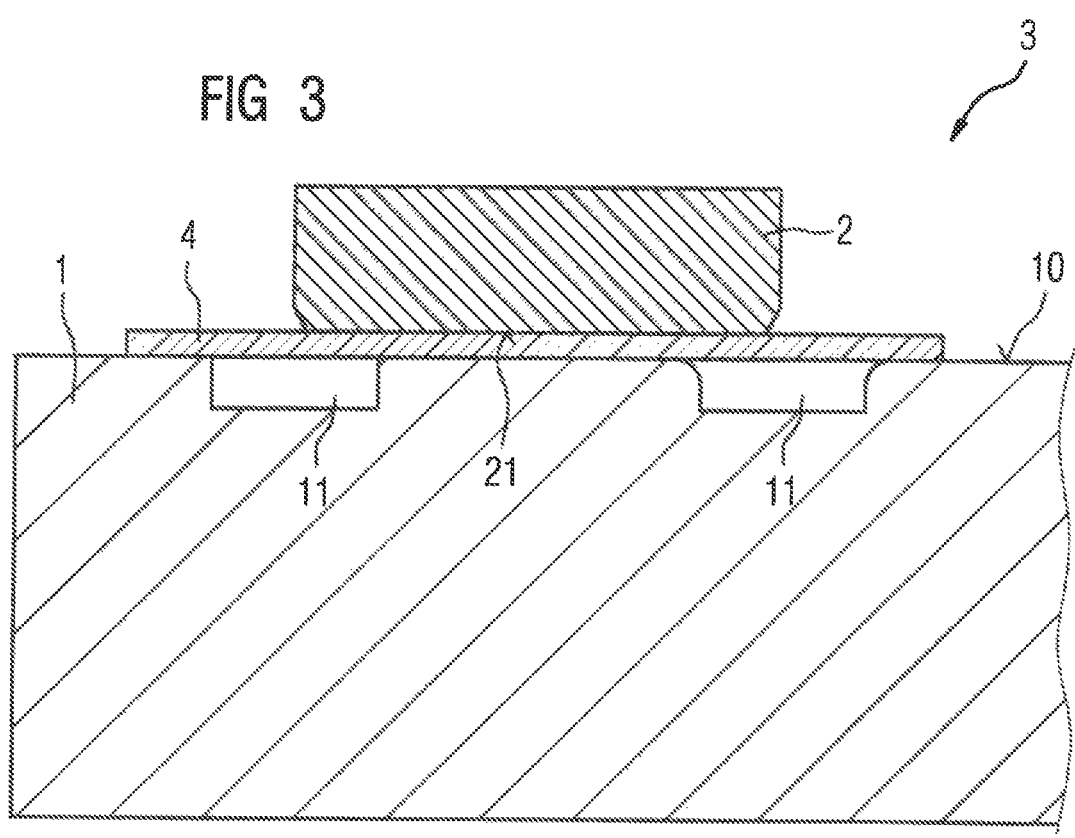
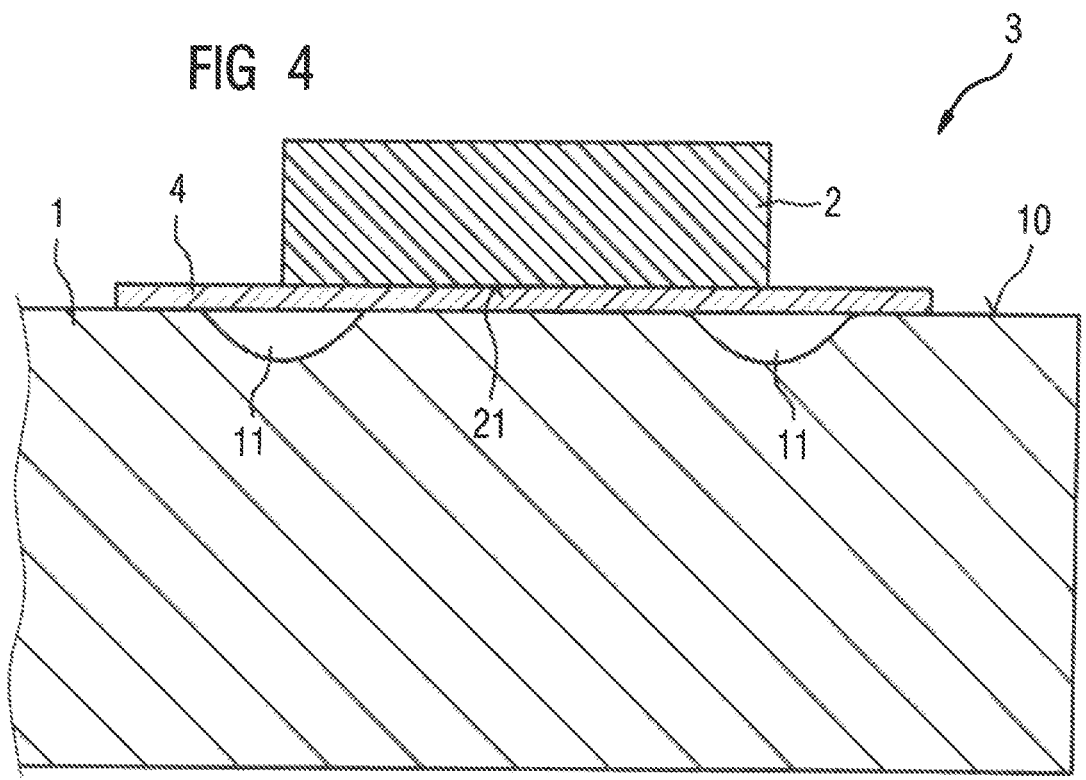

CONTACT SYSTEM HAVING RELIABLE INSULATION

CROSS-REFERENCES TO RELATED APPLICATIONS

This application is the U.S. National Stage of International Application No. PCT/EP2021/069637, filed Jul. 14, 2021, which designated the United States and has been published as International Publication No. WO 2022/028835 A1 and which claims the priority of European Patent Application, Ser. No. 20/189,973.9, filed Aug. 7, 2020, pursuant to 35 U.S.C. 119 (a)-(d).

BACKGROUND OF THE INVENTION

The invention relates to a heat sink, said heat sink having a first surface for contacting with a support body, in particular for contacting in an electrically insulated and/or heat-conducting manner. The invention further relates to a contact system having such a heat sink and a support body. The invention further relates to a method for producing such a contact system.

In the construction of electrical devices or components, it is often necessary to connect two bodies, for example a heat sink and a support body, mechanically and also thermally in some cases. In order to implement this connection, also referred to as contacting, in an electrically insulating manner, the two structural elements carrying different electrical potentials can be separated by an insulating layer having electrically insulating effect.

Evidence shows that this insulating layer suffers damage during contacting or during operation of the device or component and then, suddenly or in a creeping manner over time, loses the electrically insulating effect as a consequence.

The object of the invention is to improve a contact system for contacting, in particular for contacting in an electrically insulating manner.

SUMMARY OF THE INVENTION

This object is achieved by a heat sink, said heat sink having a first surface for contacting with a support body in an electrically insulated and/or heat-conducting manner, said first surface having at least one recess, said recess being located at least sectionally in a region of the first surface, which region is intended for contacting with the periphery of a contact area of the support body. In this case, the recess forms an unbroken track on the first surface of the heat sink. The object is further achieved by a contact system having such a heat sink and a support body, a contact area of the support body being located on the heat sink in such a way that the recess of the heat sink extends completely along the periphery of the contact area. The object is further achieved by a method for producing such a contact system, the support body being positioned on the heat sink in such a way that the entire periphery of the contact area of the support body extends along the recess of the heat sink.

Further advantageous embodiments of the invention are specified in the dependent claims.

The invention is based inter alia on the finding that the electrically insulating effect can be significantly improved, in particular in respect of its reliability and longevity, if a recess is present at that location on the heat sink which is intended for the contacting with the support body. Evidence shows for example that flaws in the structural element, such as burrs caused by cutting processes for example, result in a risk of damage to the insulating layer. Said risk increases with the force with which the support body is pressed onto the heat sink during assembly and/or on a lasting basis. The insulating layer is usually thin and/or soft, and therefore a burr can result in a change and/or damage to the insulating layer. In this way, the electrically insulating effect can be lost suddenly or decrease over time.

This insulating layer with electrically insulating effect ensures that no electrical current flows, even if the heat sink and the support body have different electrical potentials.

Even if the support body is arranged directly on the heat sink, i.e. without an intermediate insulating layer, the recess has advantages. Due to the mechanical flaws such as burrs that are present on the surface for example, the two bodies (heat sink and support body) do not lie against each other in a planar manner. This can negatively affect the operating characteristics. For example, heat transmission from an electrical or electronic component to a heat sink is impaired thereby. This means that heat dissipation can no longer be guaranteed in some circumstances. This results in a shorter service life or failure of the component. In other words, the recess of the heat sink makes it possible to ensure that heat sink and support body lie against each other hi a planar manner at the contact area beyond the recess and that good heat transmission is achieved.

By virtue of the recess on the first surface of the heat sink, the negative effect of the burrs can be largely avoided. As a result of the recesses, the superelevations caused by the burrs at the periphery of the contact area no longer result in a separation, however small, between heat sink and support body. The unevennesses are accommodated by the recesses, and the remaining plane part of the contact area of the support body then lies against the heat sink in a planar manner. This also produces for example particularly good heat transmission between heat sink and support body.

The damaging effect of the burrs on an insulating layer can likewise be overcome or at least significantly reduced if there is no counterforce from the heat sink at the relevant location of the contact area, i.e. in particular at the periphery of the contact area of the support body. This then also means that no force or only a slight force acts on the intermediate insulating layer. This is due to the recess. The recess is advantageously located on the first surface such that it extends along of the periphery of the contact area of the support body. In this case, a burr that is present at the periphery of the contact area of the support body is reliably prevented from damaging and/or destroying the insulating layer.

In this case, it can be advantageous to implement only one recess at a location which corresponds to only one part of the periphery of the contact area of the support body. In the event for example that the risk of mechanical interference (for example a burr) is only present at a few locations on the support body, the recess can be limited to that region where that periphery of the contact area of the support body intended for contacting has an increased risk of the presence of a burr.

Evidence shows that the risk of damage to the insulating layer increases as the dimensions of the support body, in particular the dimensions of the contact area of the support body, increase. In particular the risk of damage is also increased by a greater peripheral length.

By virtue of the recesses on the heat sink, it is possible to reduce the requirements, for example in the form of a structural element specification, for an absence of burrs. It is thereby possible to reduce the manufacturing costs of the structural element concerned. Since an absence of burrs cannot always be guaranteed, the rejection rate or the outlay for reworking and in particular manual reworking to ensure the required quality is reduced. Quality testing in the context of assembly can likewise be simplified.

It is moreover advantageous that the insulating layer can be thinner in design. By virtue of the recesses and the force at the burrs of the contact area being lower or eliminated as a consequence, the risk of damage to the insulating layer is so slight that a thicker insulating layer, designed as a precaution to preserve the electrically insulating effect, is no longer necessary. The thickness of the insulating layer can then advantageously depend solely on the electrical insulating capability. The insulating layer can therefore be particularly thin. This is economical and particularly easy to process. At the same time, good heat transmission is ensured.

The insulating layer can partially overlap the recess. The material for the insulating layer is then used economically. Alternatively, it is also advantageous for the insulating layer to cover the recess completely. This reliably prevents any contamination from settling in the recess, for example.

The first surface is embodied substantially as a flat area in this case. Substantially means that the major part of the first surface, for example more than 80%, is embodied as a flat area. In addition to the flat area, portions can also deviate from the flat surface. These sections include for example the recess, devices for fastening the heat sink and support body, for example threaded rods or threaded/unthreaded holes, assembly devices and handles or handle troughs for holding or transporting the heat sink. A heat sink can also have a plurality of flat areas to which elements can be attached for cooling. A heat sink can therefore be designed for example in the shape of a Z, and have a plurality of partial plates which are for example soldered or welded together.

At least in the region of the intended contact area with the support body, it is advantageous for this part of the first surface to be flat. It is thereby possible to achieve a close-fitting connection which, as well as high mechanical stability, also ensures for example good heat transmission. In addition to this, an insulating layer, in particular an insulating layer for electrical insulation, can also be located between heat sink and support body. This ensures that unwanted electrical current can reliably be prevented, even if heat sink and support body have different electrical potentials. By virtue of the flat embodiment of the first surface of the heat sink and the contact area of the support body, it is ensured that the insulating layer, in particular an insulating film, is not exposed to any force, or is only exposed to a slight force, which could cause the layer or film to be torn. By virtue of the flat surface, there is no requirement or only a slight requirement for tear-resistance of the film or the insulating layer.

In an advantageous embodiment of the invention, the recess is designed in such a way that the recess extends completely along the region that is intended for contacting with the periphery of the contact area of the support body. The entire periphery of the contact area often represents the greatest potential risk for the development of edges and burrs, which prevent planar positioning and/or cause damage to the insulating layer. Therefore if the entire periphery of the contact area precisely meets this recess when the support body is contacted with the heat sink, the support body rests on the heat sink in a planar manner. If an insulating layer is present between support body and heat sink, by virtue of the recess, said insulating layer is not exposed to any mechanical load or is only exposed to slight mechanical load. It is therefore advantageous for the recess to extend along the entire periphery of the contact area.

Using this arrangement, it is possible to ensure a uniform pressure over the major part of the contact area between heat sink and support body. In the case of direct contacting, this results inter glia in a good heat transmission, or in the case of an intermediate insulating layer, it results in uniform and moderate loading of the insulating layer, which protects the insulating layer from damage in a reliable and lasting manner.

In a further advantageous embodiment of the invention, the heat sink has multiple unbroken tracks of recesses. By virtue of the multiple unbroken tracks, it is possible to connect either a plurality of support bodies to the heat sink or variously embodied support bodies to the heat sink. The heat sink can therefore be embodied in a particularly flexible manner and is suitable both for cooling multiple components and for receiving variously embodied support bodies, and is consequently particularly flexible in terms of deployment.

In a further advantageous embodiment of the invention, the cross section of the recess is designed to be rectangular or rounded. It is particularly easy to introduce a rectangular recess into the first surface of the heat sink. This can be achieved in a simple manner using standard tools. A rounded cross-sectional area can likewise be introduced using standard tools. Since no edges are present in the case of rounded cross-sectional areas, the risk of injury during assembly is also reduced thereby. Likewise, if the recess is embodied with a rounded cross section, there is only a slight risk of damaging the insulating layer, particularly if the insulating layer is designed as a film.

In a further advantageous embodiment of the invention, the transition zone between the recess and the flat part of the first surface is so designed as to be chamfered. By virtue of the chamfered design, it can be ensured that the heat sink and in particular the first surface thereof is also free of burrs. In other words, the first surface of the heat sink is designed to be burr-free. This ensures that support body and heat sink lie against each other in a planar manner and any intermediate insulating layer that may be present is not exposed to a high load or high pressure. This means that the risk of damage can be further reduced and the longevity of the insulating effect can be increased if the edges of the recess are chamfered.

In a further advantageous embodiment of the invention, an electrically insulating layer is located between the heat sink and the support body. The planar flat connection of heat sink and support body results in an extremely low load on an insulating layer that is arranged between the heat sink and the support body, There is little or no risk of the insulating layer being torn or penetrated. Tearing or penetration would result in loss of the insulating effect, in particular an electrically insulating effect. The insulating layer can therefore be particularly thin. At the same time, it can still overlap part or all of the recess, thereby creating a flat surface which is free of dirt and/or dust deposits.

In particular, the described embodiment proves satisfactory when using very soft or thin insulations with very thick support bodies, and when a force from the support body is applied to the heat sink.

It is advantageous if it can be ensured that main body, support body and insulation cannot be moved against each other. The load on the insulating layer is then particularly low and damage becomes at least almost impossible, even in the case of thin insulating layers.

In a further advantageous embodiment of the invention, the electrically insulating layer is thermally conductive. A particular advantage of the arrangement is that the insulating layer can be designed to be particularly thin. It is therefore suitable in particular for connecting together two bodies between which a heat exchange is to take place. One example of such an application is an electrical or electronic structural element as a support body on the heat sink. A heat-conducting insulating layer having electrically insulating effect is often located between structural element and heat sink for the purpose of electrical insulation.

Every substance has a degree of thermal conductivity, however low. In this context, thermally conductive is understood to mean having a thermal conductivity greater than $$\lambda = 0.1 \frac{W}{m \cdot K}.$$

Electrically insulating and resilient materials having a corresponding thermal conductivity are available for the insulating layer. Furthermore, where there is a requirement for good thermal conductivity, heat-conducting pads having a thermal conductivity greater than $$\lambda = 10 \frac{W}{m \cdot K}$$

can be used. These are specifically optimized for thermal conductivity and are correspondingly sensitive to mechanical damage. The proposed arrangement is therefore suitable in particular for an insulating layer having a thermal conductivity greater than $$\lambda = 10 \frac{W}{m \cdot K}.$$

In a further advantageous embodiment of the invention, the electrically insulating layer is formed by a film. A film is particularly easy to use and process during production. Rolled onto a roller, the required quantity can easily be supplied and processed in the production process. The disadvantage of the risk of tearing the film is reliably avoided as a result of the recess in the heat sink. Use of the film as an insulating layer is therefore particularly advantageous. Furthermore, a film allows in particular even very high potential differences to be electrically insulated from each other using only a small film thickness. Furthermore, the use of an adhesive-coated film is particularly advantageous. This is likewise thin and therefore has particularly good thermal conductivity. Furthermore, any movement of the film relative to the heat sink and/or the support body is reliably prevented. This ensures good heat transmission on a lasting basis and good electrical insulation on a lasting basis.

In a further advantageous embodiment of the invention, the insulating Dyer covers the recess in such a way that a closed channel is formed by recess and insulating layer. The covering of the recess reduces the risk of contamination in the recess. The contacting often requires an electrically insulating property between heat sink and support body. Contamination in the specific region of the recess can result in leakage paths which reduce the electrical insulating capability. In other words, the prevention of contamination can protect the electrical insulation on a lasting basis. A corresponding arrangement therefore has a long service life and high reliability.

In a further advantageous embodiment of the invention, a gel-type material is arranged in the recess. The gel-type material can be for example a gel-type liquid. This can be for example a liquid, in particular a thermally conductive liquid, which has a higher viscosity than water. As a result of the closed channel, this liquid is held in the recess and can improve the thermal performance, i.e. the heat transfer to the heat sink. Alternatively, a material having an adaptable shape such as rubber can be introduced into the recess. This means that hi particular a film fits closely as a heat-conducting layer and the risk of tearing is significantly reduced.

In a further advantageous embodiment of the invention, the support body is formed by a current bar, Current bars are often made from copper. This is shaped to produce current bars, usually by means of a cutting process, which leaves a burr at the periphery of the current bar. Where contacting is effected by means of an insulating layer such as for example a film, this film or layer can be damaged by said burr. The proposed heat sink is therefore particularly suitable for contacting a current bar and a heat sink because, even without post-treatment, current bars can be reliably and safely connected to the heat sink in this way.

In a further advantageous embodiment of the invention, the contact system has multiple current bars, in particular three current bars, the heat sink having multiple unbroken tracks of recesses, and the number of tracks of recesses corresponding to the number of current bars. A three-phase system of current bars, for example for connecting to a power converter, can be cooled by a heat sink in this case. As a result of fastening this to the heat sink, in addition to the cooling, the separation that is required for electrical insulation between the current bars can be established by the fastening of the current bars to the heat sink. In addition to this, the assembly of the current bars is simplified and the susceptibility to damage during assembly is reduced by the recesses in the heat sink.

In a further advantageous embodiment of the invention, the support body is connected to the heat sink by means of a fastening device in a manner which does not allow movement. Using this type of connection, any relative movement between the heat sink and the support body is prevented. Such relative movement produces wear and associated degradation of the contact area. If the areas are directly in contact with each other, this results in roughening of the surfaces. In the case of an intermediate layer such as a film, this layer is exposed to mechanical stress. By virtue of a connection which does not allow movement, occurrences of wear are prevented on a lasting basis and a reliable and lasting heat transfer function is guaranteed at the same time as protecting the electrical insulation capability.

BRIEF DESCRIPTION OF THE DRAWING

The invention is described and explained in greater detail below with reference to the exemplary embodiments illustrated in the figures, in which:

FIG. 3, FIG. 4 show exemplary embodiments of a contact system with proposed recess.

DETAILED DESCRIPTION OF PREFERRED EMBODIMENTS

Figure 1:
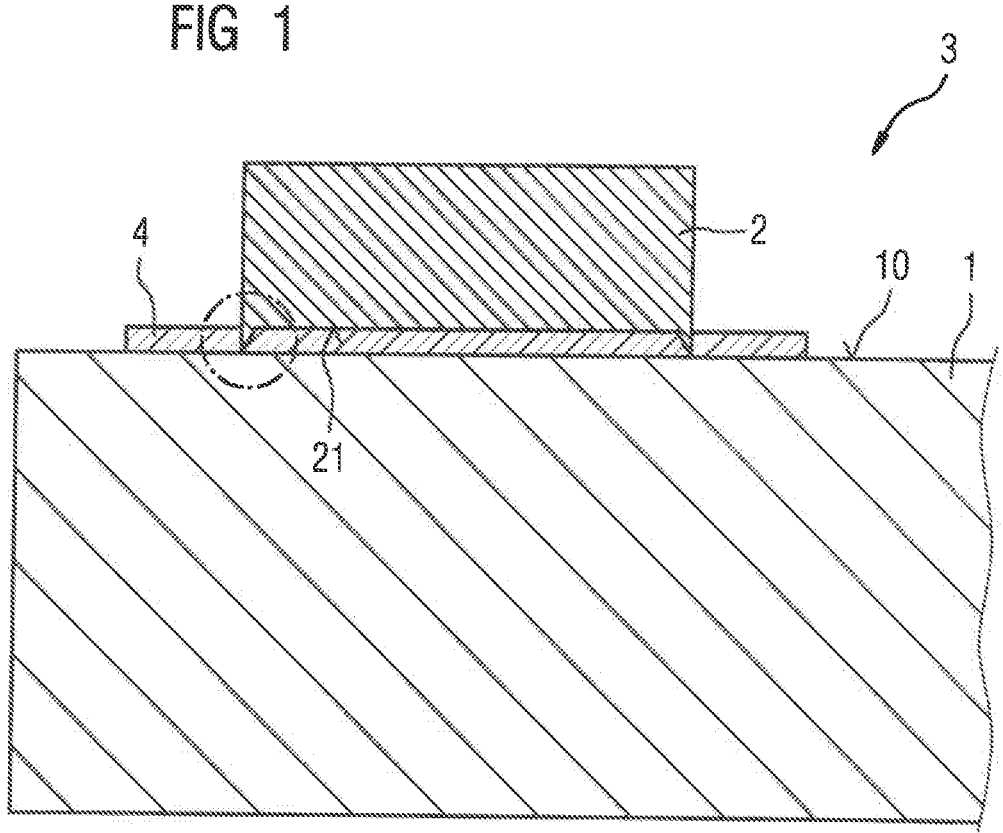
FIG. 1 shows a contact system according to the prior art.

FIG. 1 shows the cross section of a contact system 3. The contact system comprises a heat sink 1 and a support body 2 with a reliable insulation in the form of an insulating layer 4. The insulating layer 4 is located between the heat sink 1 and the support body 2. For this, the heat sink 1 has a first surface 10 which is intended for the contacting with the support body 2. The support body 2 has a contact area 21 which is intended for the contacting with the first surface 10 of the heat sink 1.

For the sake of clarity, elements for ensuring a lasting contact between heat sink 1 and support body 2 have been omitted. This can be realized by means of for example a screw connection, a spring connection, a clamping connection, etc. These can be referred to generally as fastening devices. The support body 2 can take the form of for example a semiconductor module or a current bar. In the case of a contact system 3 comprising heat sink 1 and current bar, for example, it must also be ensured that there are no equalizing currents between heat sink 1 and support body 2 as a result of different electrical potentials. Heat sink 1 and support body 2 are therefore electrically insulated from each other by means of the insulating layer 4. Unwanted equalizing currents between these bodies 1, 2 are prevented thereby.

The contact system 3 therefore has a three-layer structure comprising the heat sink 1 with a first electrical potential, an insulating layer 4, and a support body 2 which carries a second electrical potential, the first and the second electrical potentials generally differing from each other. The structure of this exemplary embodiment serves to cool a current bar via a heat sink 1 for example. The current bar forms the support body 2 in this case.

Figure 2:
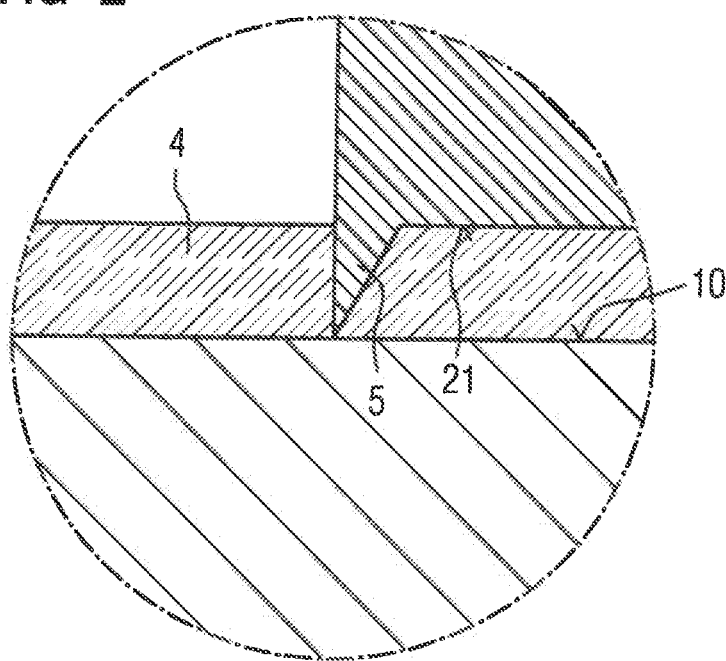
FIG. 2 shows a detail view of the previously cited contact system.

FIG. 2 is a detail view of the circular region shown in FIG. 1 on the left-hand side of the periphery of the support body 2. In order to avoid repetition, reference is made to the description of FIG. 1 and to the reference signs assigned there. It can be seen from the support body 2 in this case that it has a geometric flaw, for example a burr 5, which projects from the regular geometry of the structural element. This flaw could penetrate the insulating layer 4 completely when the support body 2 is pressed or pushed onto the heat sink 1, resulting in an electrical contact between heat sink 1 and support body 2 and therefore an unwanted electrical connection of the potentials that must be separated. Alternatively, it could penetrate the insulating layer 4 only partially, as a result of which the contact, for example due to effects of settling or partial discharge, might only occur after a time delay and might not be reliably identifiable in tests.

The effect of the flaw is particularly critical if the insulating layer 4 is very thin and/or soft, which applies in the case of for example limited structural space or the need for thermal penetration.

FIG. 3 shows an exemplary embodiment of the proposed contact system 3 in cross section. In order to avoid repetition, reference is made to the description of FIG. 1 and FIG. 2 and to the reference signs assigned there. In this exemplary embodiment, recesses 11 have been introduced into the first surface 10 of the heat sink 1. These counteract geometric flaws that are present, for example a burr 5 of the support body 1.

The support body 2 ideally has chamfered edges as per its specification for protecting the insulating layer 4 against damage. In the illustration according to FIG. 3, the right-hand edge of the support body 2 at the transition zone to the contact area 21 is designed as a beveled edge and the left-hand edge of the support body 2 at the transition zone to the contact area 21 as rounded edges. This does not however provide reliable protection against projecting parts of the support body 2, The risk of damage is therefore reduced but not eliminated.

Therefore, in order to improve the contact system 3 in terms of contacting with electrical insulation, one or more recesses are provided on the first surface 10 of the heat sink 1, These are able to accommodate projecting geometric flaws such as for example a burr 5, without pressure being exerted on the intermediate insulating layer 4, This offers reliable protection for the insulating layer 4, because the recesses 11 allow the insulating layer 4 to withdraw into a hollow space of the recess 11 if burrs 5 or other protruding geometric flaws are placed thereon. The force effect on the insulating layer 4 is significantly reduced thereby and prevents the insulating layer 4 from being damaged or even penetrated by the support body 2. The hollow space is formed by means of a material recess, designated recess 11, in the heat sink 1. In the case of a contact system 3, this is advantageously located at the edge of the contact area 21 of the support body 1. It can have a rectangular cross section in particular, as illustrated in the left-hand recess 11. Alternatively or additionally, it is also possible for the recess 11 to have a rounded cross section, in particular at the transition zone to the first surface 10. Furthermore, cross sections which are shaped differently are also possible and effective for the recess 11.

The insulating layer 4 can overlap the hollow space completely as illustrated, but can also overlap the hollow space only partially.

Furthermore, FIG. 4 shows the cross section of a further exemplary embodiment having an oval cross section of the recess 11. In order to avoid repetition in the explanation for FIG. 4, reference is made to the description of FIGS. 1 to 3 and to the reference signs assigned there. The heat sink 1 advantageously has a chamfered edge, in particular on that side which is overhung by support body 2. This again reduces the load on the insulating layer 4. Particularly in the case in which the insulating layer 4 actually overlaps the entire recess 11, It has proven advantageous to additionally likewise embody the edge on the opposite side of the recess as a chamfered edge. The chamfered edge prevents the heat sink 1 from penetrating into the insulating layer.

Figure 5:
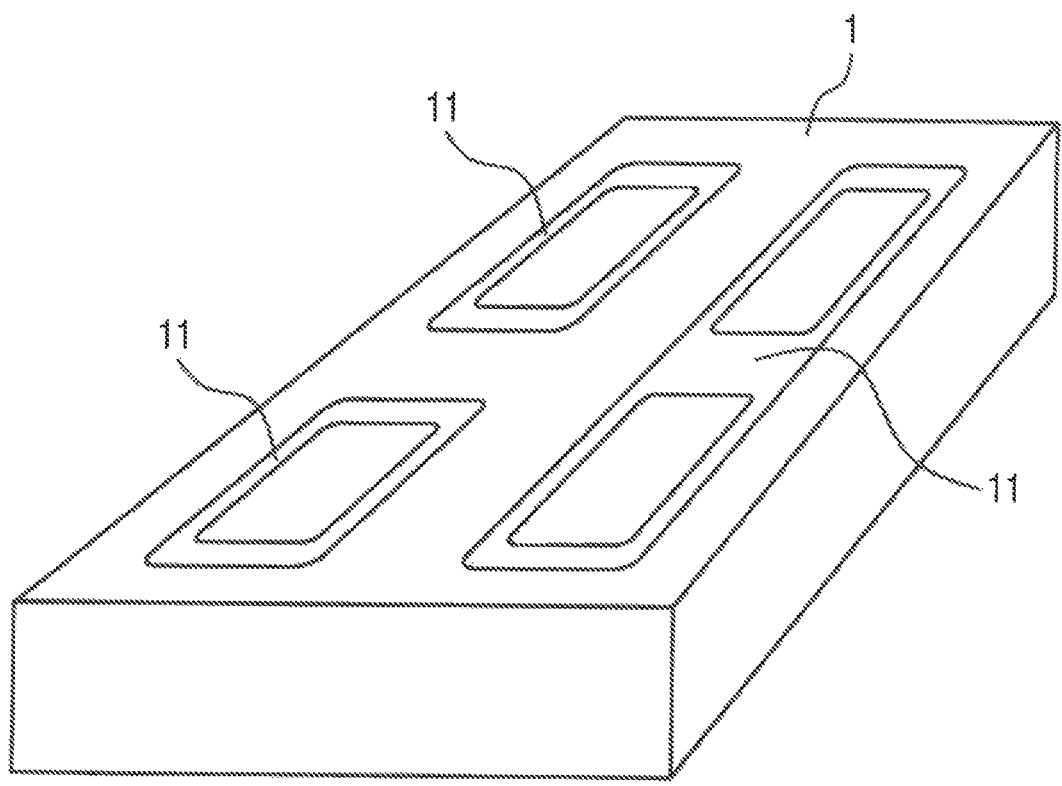
FIG. 5 shows an unbroken track of a recess.

FIG. 5 shows a further heat sink 1 with recesses 11. By virtue of the perspective illustration, the unbroken tracks of the recesses 11 can be seen, Two separate recesses 11 are provided in the left-hand part of the heat sink 1, allowing two support bodies 2 to be contacted. The support bodies 2 in this case have a contact area which is for example rectangular and overlaps parts of the recess 11 when contacted, A recess in the form of a figure-8 is shown in the right-hand part of the heat sink 1. The different sections of the recess can have different widths in this case. In particular, the central path of the recess can be wider in the figure-8-shaped embodiment. This allows greater flexibility in the utilization of the heat sink. The track in the figure-8-shaped embodiment of the recess 11 is likewise an unbroken track. For example, two support bodies 2 can be contacted at this recess 11. The recess is then used by both support bodies 2 at the central path of the recess 11. It is alternatively also possible respectively to contact a large support body 2 which uses only the outer part of the recess 11. This type of recess 11 is particularly flexible, since different embodiments of the support body 2 can be connected to the heat sink 1 while making full use of the cited advantages.

In summary, the invention relates to a heat sink for contacting with a support body in an electrically insulated and/or heat-conducting manner, said heat sink having a first surface. For improved contacting, it is proposed that the first surface should have at least one recess, said recess being located in a region of the first surface, which region is intended for contacting with the periphery of a contact area of the support body, said recess forming an unbroken track on the first surface, and said first surface being embodied substantially as a flat area. The invention further relates to a contact system having such a heat sink and a support body, a contact area of the support body being located on the heat sink in such a way that the recess of the heat sink extends completely along the periphery of the contact area. The invention further relates to a method for producing such a contact system, the support body being positioned on the heat sink in such a way that the entire periphery of the contact area of the support body extends along the recess of the heat sink.

What is claimed is:

1. A contact system, comprising:
    a support body;
    a heat sink configured to contact the support body in an electrically Insulated and/or heat-conducting manner, said heat sink having a first surface which is embodied substantially as a flat area and formed with a recess in a region intended for contacting a periphery of a contact area of the support body, said recess forming an unbroken track on the first surface of the heat sink, wherein the contact area of the support body is located on the heat sink in such a way that the recess extends completely along the periphery of the contact area; and
    an electrically insulating layer arranged between the heat sink and the support body and configured to cover the recess in such a way that a closed channel is formed by the recess and the insulating layer.

2. The contact system of claim 1, wherein the heat sink includes a plurality of said recess to form corresponding unbroken tracks.

3. The contact system of claim 1, wherein the recess has a cross section of rectangular or rounded configuration.

4. The contact system of claim 1, wherein a transition zone between the recess and a flat part of the first surface is chamfered.

5. The contact system of claim 1, wherein the electrically insulating layer is thermally conductive.

6. The contact system of claim 1, wherein the electrically insulating layer is formed by a film.

7. The contact system of claim 1, further comprising a gel-type material arranged in the recess.

8. The contact system of claim 3, wherein the support body is formed by a current bar.

9. The contact system of claim 1, further comprising multiple current bars, and a plurality of said recess to form corresponding unbroken tracks, wherein a number of recesses corresponds to a number of current bars.

10. The contact system of claim 1, wherein the number of current bars is three.

11. The contact system of claim 1, further comprising a fastening device configured to connect the support body to the heat sink in a manner which does not allow movement.

12. A method for producing a contact system, said method comprising:
    arranging an insulating layer on a heat sink so as to cover a recess in the heat sink and to form a closed channel by the recess and the insulating layer; and
    positioning a support body on the heat sink in such a way that the insulating layer is arranged between the heat sink and the support body and an entire periphery of a contact area of the support body with the heat sink extends along the recess of the heat sink.

13. The method of claim 12, wherein the heat sink includes a plurality of said recess to form corresponding unbroken tracks.

14. The method of claim 12, wherein the recess has a cross section of rectangular or rounded configuration.

15. The method of claim 12, further comprising chamfering a transition zone between the recess and a flat part of the heat sink.

16. The method of claim 12, wherein the electrically insulating layer is thermally conductive.

17. The method of claim 12, wherein the electrically insulating layer is formed by a film.

18. The method of claim 12, further comprising arranging a gel-type material in the recess.

19. The method of claim 12, wherein the support body is formed by a current bar.

20. The method of claim 12, further comprising connecting the support body to the heat sink in a manner which does not allow movement.

* * * * *